ELECTRICAL CIRCUITRY

Filed Aug. 1, 1962 2 Sheets-Sheet 1

INVENTOR
WILLIAM C. BROWN
BY Herbert F. Sonnemeyer
ATTORNEY

July 6, 1965 W. C. BROWN 3,193,789

ELECTRICAL CIRCUITRY

Filed Aug. 1, 1962 2 Sheets-Sheet 2

INVENTOR
WILLIAM C. BROWN
BY Herbert F. Sonnemeyer
ATTORNEY

United States Patent Office 3,193,789
Patented July 6, 1965

3,193,789

ELECTRICAL CIRCUITRY

William C. Brown, Edina, Minn., assignor to Sperry Rand Corporation, New York, N.Y., a corporation of Delaware Filed Aug. 1, 1962, Ser. No. 214,012
9 Claims. (Cl. 339—18)

This invention relates generally to the electrical interconnection of circuitry disposed on the separate layers of a stacked circuit assembly and more specifically to a deformable interconnecting means disposed between opposing terminals on adjacent layers.

Printed circuits are well known and extensively used in the electronics industry. Recent trends in the industry toward miniaturization of electronic devices have resulted in a variety of printed circuit packaging schemes for arranging a compact circuit assembly. For reducing circuit card space requirements, special packaging techniques have been developed which permit integration of the circuit cards into a single unit. In one such technique, the printed circuit cards are disposed in stacked or superimposed relation.

Accompanying the stacked arrangement of circuit cards is the problem of electrically interconnecting the circuitry on the different card levels within the stack. More conventional methods of card interconnection use point-to-point wiring or some type of edge connecting devices. Usually these methods are used when the stacked cards are spaced apart some distance, and are not employed when the cards are stacked in direct contact with one another.

In some cases it has been determined that the design of a stacked circuit assembly would be enhanced by obviating the use of interconnecting wires or connectors and electrically interconnecting adjacent cards by having the circuit terminals of one card in direct contact with predetermined circuit terminals of the next adjacent card. Unfortunately to successfully interconnect cards in this manner, costly fabrication problems are presented. It is generally required that all of the circuit terminals on one side of the card have their surfaces in a single plane in order that mating terminal surfaces on adjacent cards make good electrical contact. This requires accurate machining and fabrication of opposing surfaces, which increases the cost of the assembly.

The present invention overcomes the requirement that the mating card surfaces be nearly perfectly planar, and permits circuit cards to be fabricated with conventional techniques and equipment. This is accomplished in accord with the present invention by providing a small piece of conductive material which may be deformed under pressure between mating circuit terminals. The circuit cards have a plurality of circuit terminals or connection pads arranged in a predetermined pattern and passing therethrough. Circuitry in the form of conductive strips terminates at preselected connection pads. The surface of each pad is exposed and flush with the level of the card insulating material, whereas the conductive strips are embedded in the insulating material.

In the preferred embodiment, each pad surface has a shallow recess or depression therein adapted to accommodate the piece of conductive material. A piece of conductive material is disposed in each pad recess on the upper surface of the circuit card prior to assembling the stack. When the cards are superimposed, the recesses in the pads on the underside of one card each receive or are disposed in close proximity to the material seated in one of the corresponding pad recesses on the upper surface of the mating card. The stack is then compressed by suitable pressure applying means disposed at the perimeter of the stack. Any pressure differential is compensated for by the inserted small pieces of material, those in areas of greater pressure being crushed or deformed to a greater degree than pieces in areas of lesser pressure. Electrical contact between facing connection pads is then made through the inserted piece of material.

This method of interconnecting the various circuit levels of a printed circuit assembly also allows the easy disassembly of the stack to permit changes to be simply made.

If it is desired, the assembly may be made permanent. To accomplish this, the small pieces of material are made from a suitable solder alloy. The circuit assembly is placed in an oven and heated to an appropriate soldering temperature. The circuit assembly is under continuous pressure and as the solder melts, the pads are wetted with the melted solder and forced together. Upon cooling, a good electrical and mechanical connection is established between mating pads.

It is, therefore, an object of this invention to provide an improved means for electrically interconnecting the individual circuit cards on a circuit card assembly.

It is also an object of this invention to provide a means for electrically interconnecting a circuit card assemby which permits the distance between the cards of the stack to be minimized.

It is another object of this invention to provide a means for electrically interconnecting individual circuit cards which compensates for variations in the planar mating surfaces of adjacent cards.

It is another object of this invention to provide a means for electrically interconnecting the circuit cards of a stacked circuit assembly which adapts to pressure variation caused by the clamping means used to secure the stack in fixed relation.

It is another object of this invention to provide a means for electrically interconnecting the circuit cards of a stacked circuit assembly which interconnection may be made permanent by the application of heat.

It is another object of this invenion to provide a means for electrically interconnecting the individual circuit cards of the circuit assembly which permits easy disassembly.

These and other more detailed and specific objects will be disclosed in the course of the following specification, reference being had to the accompanying drawings, in which.

Figure 1:
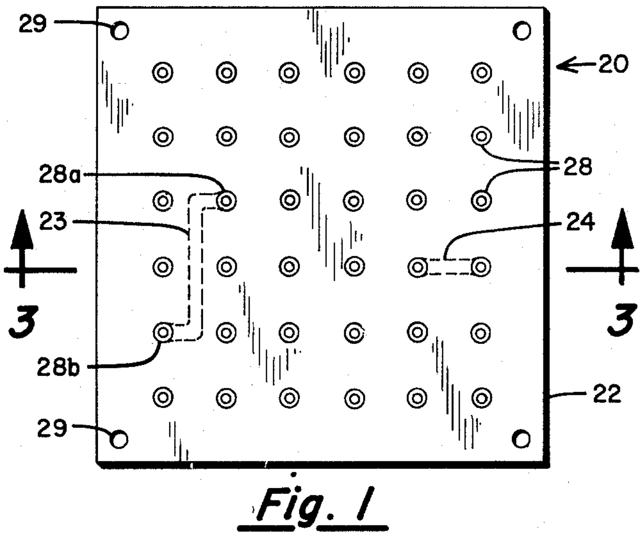
FIG. 1 is a top plan view of a stack of printed circuit cards of the type used in the present invention.

Referring now to FIG. 1, there is seen a top view of a printed circuit card 20 of the type employed in the preferred embodiment of the present invention. The card 20 includes an insulating support or base material 22, embedded conductive strips 23 and 24, and a plurality of connection pads 28, some of which form the terminal portions of the conductive strips, for example, as pads **28*a* and 28*b*. Four apertures 29 are formed at the corners of the card. As will be seen hereinafter, these apertures receive a pressure means and facilitate the alignment of the circuit cards when they are assembled into a stack. The base material 22 is preferably an epoxy-type composition, but other suitable insulating materials may be substituted therefor. The conductive strips and connection pads are preferably copper but may be fabricated from other conductive materials, such as brass or beryllium-copper. As can be seen from FIG. 3, the connection pads 28** are disposed throughout the card in accord with the predetermined pattern and extend from the upper to the lower side of the card. The pads have their major exposed surfaces flush with the surface of the insulating portion of the card. In the prferred embodiment of the present invention the thickness of the card 20 and the length of the connection pads 28 is approximately 0.015 inch. Also, the pads may be formed at intersections of lines forming a 0.100 inch grid. No limitation is, however, thereby intended for the connection pads may be arranged according to any pattern compatible with the circuit design.

Figure 2:
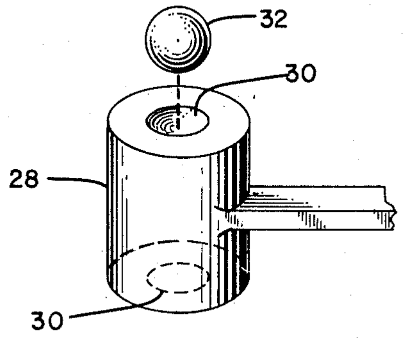
FIG. 2 is an enlarged perspective view of a single connection pad.

As is best seen in FIG. 2, each pad 28 has in the central portion of its exposed surfaces a recessed zone or recess 30. The recess is generally circular in form and has a depth of approximately 0.006 inch. As will be explained hereinafter the pads may be formed with the depressions on one side only, the other side remaining flat. Each recess 30 receives a small slug or sphere 32 which has a diameter of approximately 0.012 inch. The sphere is composed of a relatively soft conductive material such as a lead-tin alloy consisting of 60% lead and the remainder tin. Other conductive materials may be used instead of a lead-tin alloy, as long as the material used is softer than the connection pad material. Also, it is not imperative that the soft material selected takes the shape of a sphere as is illustrated. Its geometry may vary almost as desired, since many shapes are suitable for the application herein described. A spherical shape was chosen in the preferred embodiment because of the ability of a sphere to seat itself in the approximate center of the pad recess and because a spherical shape is economically produced.

Figure 3:
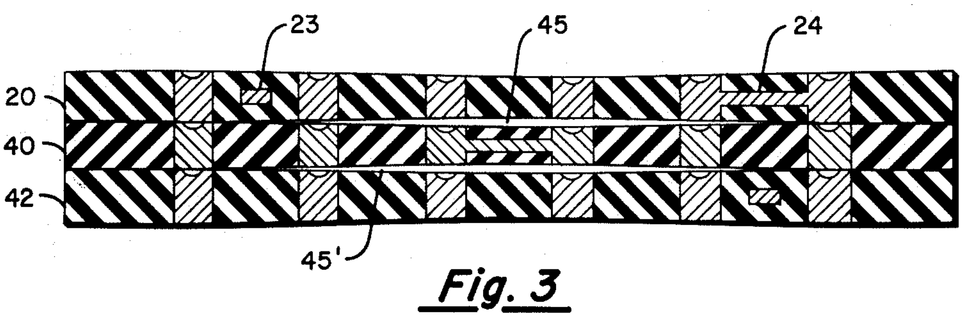
FIG. 3 is a cross sectional side view of the FIG. 1 apparatus taken along the lines 3—3.

Referring now to FIG. 3, there may be seen printed circuit cards 20, 40 and 42 in superimposed registered relation. The cards 40 and 42 are substantially identical to circuit card 20, with the exception that the different cards exhibit different circuit patterns. The printed circuit card of this invention may be formed in a sequence of steps which would include selectively etching one side of a copper sheet to a predetermined depth to form a plurality of flat elevated areas thereon. The recessed or etched out portion of the copper sheet is then filled with an epoxy resin to the level of the elevated areas. The oppoiste side of the copper sheet is then etched in the same manner, the etching step being interrupted so that a suitable etchant resist may be deposited in those areas where conductive strips are to be formed. The etching step is then continued until all remaining undesirable copper is removed. The recessed portions are filled with an epoxy resin as before. The depression in each exposed connector pad may then be formed, for example, by etching or drilling. It should be noted that the connection pads may be elevated above the card surface rather than flush therewith. In such a case, it would not be an aboslute necessity to embed the conductive strips.

The FIG. 3 arrangement illustrates the problem solved by the present invention. The circuit cards have been superimposed but without any spheres being located in the recesses of mating connection pads. It is seen that at the perimeter of the stack the adjacent cards have their opposing surfaces in abutting relation. However, in the middle of the stack there are voids 45 and 45′ between the adjacent card surfaces and no electrical contact is made between the aligned connection pads 28 located in that area. The voids which have been exaggerated for purposes of illustration, exist because the underside of card 20 and the upper side of card 40 were not originally level or plane. The same reason applies to the existence of the void 45′ with respect to the under surface of the card 40 and the upper surface of the card 42. It should be understood that the surface distortion is of such a degree that perimeter clamping pressure would result in damage to the assembly before it would result in an electrical contact of the aligned pads 28 in the central portion of the assembly.

Figure 4:
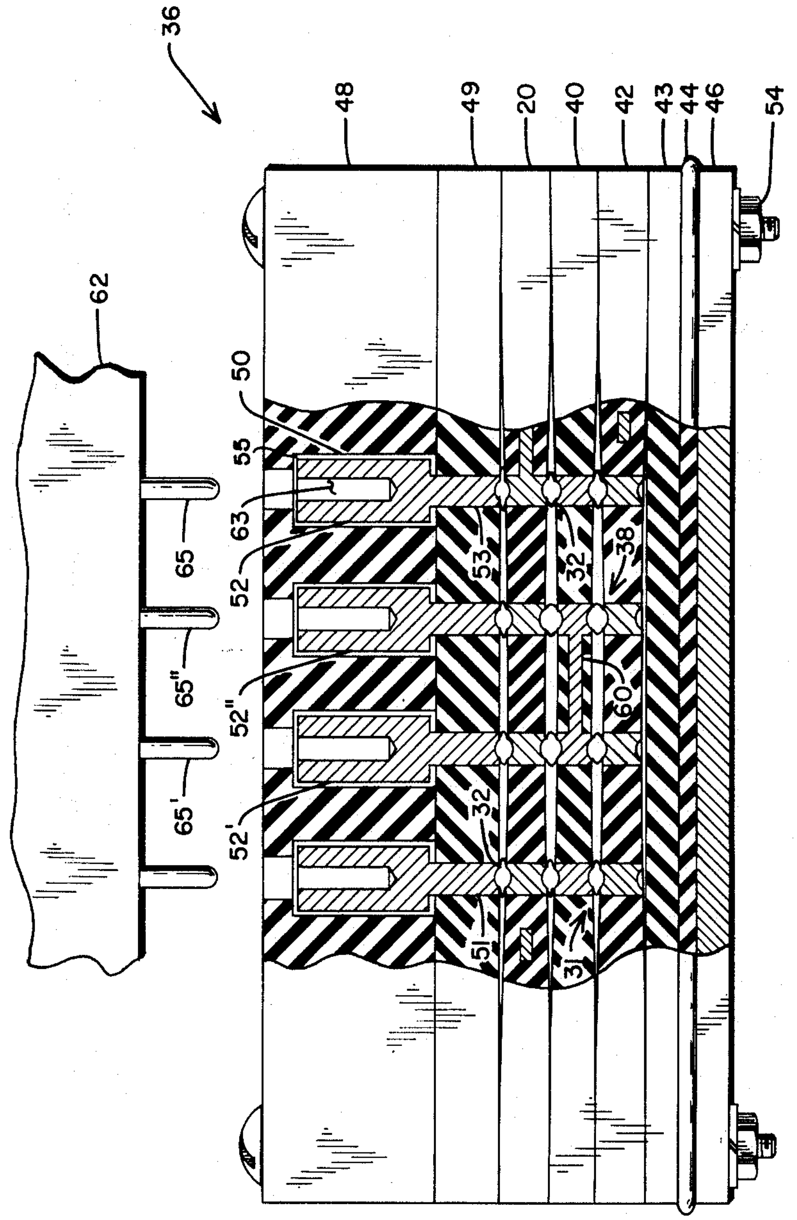
FIG. 4 is a cross sectional side view of a circuit assembly employing the interconnecting means of the present invention.

Referring now to FIG. 4, there may be seen the circuit cards 20, 40 and 42 forming a portion of a circuit assembly 36. The cards are mounted on an insulating protective cover plate 43, a resilient pressure pad 44, and a backup pressure plate 46. The cover plate 43 is composed of an insulating material, such as an epoxy resin, and the pad 44 is preferably fabricated from a resilient insulating material, such as rubber. The backup plate 46 is made of steel or some other rigid non-compressible material. A pressure or clamping means in the form of a nut and bolt arrangement 54 secures the various members in fixed relation and is utilized to apply pressure to the assembly. Four such bolts pass through the assembly at the perimeter thereof by way of holes formed near the corners of the various assembly members. For the sake of clartiy, these holes have not been illustrated, but it may be assumed that their arrangement in each member is exemplified by the holes 29 in the card 20 seen in FIG. 1. The pressure means 54 also maintains the cards in proper registration such that the connection pads are disposed in a vertically aligned series. Prior to the stacking of the cards, a sphere 32 is located in each connection pad recess on the upper surface of each card to be placed in the stack. When the assembly is compressed by way of the clamping means 54, the spheres compensate for the variation in planar surfaces previously exemplified by the voids 45 and 45′. It can be seen that the individual spheres vary in the amount that they have been deformed depending upon the amount of pressure they must bear. For example, at the location 31 in the area of greater pressure near the perimeter of the assembly, the spheres are almost flat; whereas at location 33, an area of lesser pressure, the spheres are more ellipsoidal. In both locations, however, the spheres are effective to electrically interconnect their respective associated pads.

The circuit assembly 36 includes a two part header consisting of an upper header section 48 and the lower header section 49. The header is preferably composed of a plastic insulating material such as an epoxy resin reinforced with glass fibre. In the upper section 48 there are a plurality of individual apertures 50 having a reduced diameter at one end whereat there appears the shoulders 55. The lower section 49 has a plurality of apertures 53 therein, and when the header is assembled the apertures in the lower and upper sections are aligned. In assembling the header, the major portion of a female electrical connecting pin 52 is located in the apertures 50. The shoulders 55 prevent the pin from falling through the header section 48 and are also used to transfer pressure to the pins. The lower header section 49 is then fitted to the section 48 such that the small stem portion 51 of the pin 52 seats in the apertures 53. The header with the pins 52 is then disposed on the top card 20, each of the connector pin stem portions 51 being registered with a series of aligned connector pads. The pressure means 54 also passes through the header and when tightened, the upper header section 48 transfers pressure to the remainder of the assembly and particularly to the pins 52 causing the stem portion 51 thereof to compress the series of connector pads and spheres in alignment therewith. The compression force causes the spheres 32 to seat firmly in their respective connection pad depressions 28, the spheres being distorted in varying degrees to accommodate any variation in the levels of adjacent circuit cards. It can be seen that, if desired, the connection pad surfaces on the underside of the cards need not have a depression therein. These surfaces may be left flat without departing from the scope of the invention.

After the circuit assembly 36 is fabricated, a component-carrying printed circuit card 62 (only a portion of which is illustrated) may be plugged into the assembly. Each recess 63 in the female pin 52 receives one of the electrical connecting prongs 65 associated with circuitry (not shown) on the card 62.

When the circuit card 62 is plugged into the assembly 36, pin 65′ is electrically received by the connector 52′ and pin 65″ is received by connector 52″. The pin 65′ is then electrically connected to the pin 65″ by way of the conductive strip 60 and the connection pads connected thereto thru the spheres 32. It is obvious that the assembly can be made larger to accommodate a plurality of circuit cards and that the cards may be interconnected in the same manner as is shown for interconnecting the pins 65′ and 65″.

The interconnecting means of this invention is also capable of being made permanent by the application of sufficient heat to cause the solder spheres or slugs to melt. Where such an application is intended, the materials, other than the solder, used to fabricate the assembly have sufficient heat resistance to withstand soldering temperatures without damage. The size of the solder sphere used is determined by the size of the depression and the surface area to be coated with the solder. Small solder excesses above the amount determined to be necessary for forming a reliable solder joint can be tolerated. This is so because the epoxy resin used to fabricate the insulating material surrounding each connection pad is not solder wettable and tends to repel the solder confining it to the area of the connection pad. Usually soldering is accomplished by baking the assembly in an oven at the appropriate temperature. During the soldering operation, an equal pressure distribution is required. In order to accomplish this an additional pressure plate, similar to pressure plate 46, is disposed on the exposed surface of the upper header section 48. Additionally, the pressure means would include a spring on each bolt between its associated nut and the upper pressure plate. The spring provides a constant loading force which is necessary for causing continued compression of the assembly as the spheres melt. After soldering, the pressure plates and resilient pad may be removed. The clamping means may be retained for providing additional durability to the assembly.

Although the foregoing has considered primarily the use of a solder slug as an interconnecting means, it can be seen that other electrically conductive material may be substituted therefor. For example, a silver brazing composition could be used. In such a case, the insulating base material may be a ceramic or other high temperature resistant material and the connection pads and conductive strips may be formed from titanium, molybdenum, or other suitable high melting point metals or metal alloys.

It is to be understood that suitable modifications may be made in the structure as disclosed provided such modifications come within the spirit and scope of the appended claims. Having now, therefore, fully illustrated and described my invention, what I claim to be new and desire to protect by Letters Patent is:

1. A printed circuit assembly comprising in combination: superimposed disassemblable insulating support members mounting a plurality of electrically conductive plug elements in rows and columns, said elements extending transversely and having terminal portions flush with major planar surfaces of said support members, said rows and columns of elements in each said support member being aligned with corresponding rows and columns of elements of the next adjacent support member, each of said elements containing at least one recess in one terminal portion and a substantially planar surface at another terminal portion; an electrically conductive deformable element partially received within the recess of each of said plug elements; and a means for applying force to the planar surfaces of said insulating support members thereby causing said deformable elements to deform to provide an electrical interconnection between the plug elements.

2. The invention defined in claim 1 wherein said means includes a housing disposed externally of said support members for transmitting the forces to planar surfaces of said support members for deforming said deformable elements.

3. The invention defined in claim 1 wherein said means includes a header assembly having an upper and a lower section.

4. The invention defined in claim 3 wherein said upper section contains a plurality of apertures having a reduced diameter at one portion forming a shoulder, and said lower section contains a plurality of apertures each aligned axially with each of said upper section apertures and each of said plug elements; and a connector element positioned in each of said upper section apertures and projecting into said lower section apertures, said upper section shoulder forcing said connector element axially by the application of force thereto thereby causing said connector element to deform said deformable elements.

5. The invention defined in claim 4 wherein said connector elements contain a recess for receiving the connector pins of an electrical circuit card.

6. The invention defined by claim 2 wherein said housing is adapted to receive an aligning means for transmitting said forces to the assembly.

7. Apparatus as in claim 1 wherein the slug of electrically conductive material has a lead-tin composition.

8. Apparatus as in claim 1 wherein the slug of electrically conductive material is substantially spherically shaped.

9. A printed circuit assembly comprising: a stacked plurality of disassemblable electrically insulating supports, each having a plurality of electrically conductive connection pads coordinately arranged therein and extending therethrough, said pads extending flush with major planar surfaces of said supports, each pad having two exposed major surface portions, one of the major surface portions having a recessed zone formed therein and the other exposed major surface portion being substantially planar, and the exposed portion of the connection pads of one of the supports being aligned with the exposed portion of the pads of any mutually adjacent support such that the recessed zone in the exposed major surface portion of the pads of one support are disposed in facing relation to the exposed planar major surface portion of the pads of the next adjacent support, said adjacent supports being disposed substantially in contact with each other along major planar surfaces thereof; a slug of deformable electrically conductive material located between facing connection pads and partially received within the recessed zone of one of the pads; and a means for applying pressure to the supports causing a force to be exerted in a direction normal to the major planar surfaces so that the slugs of material frictionally engage facing pads to establish an electrical connection therebetween.

References Cited by the Examiner

UNITED STATES PATENTS

| | | | |
|---|---|---|---|
| 1,559,668 | 11/25 | Brown et al. | |
| 1,909,248 | 5/33 | Benkelman | 339—100 X |
| 2,006,436 | 7/35 | Bowers | 339—18 |
| 2,095,254 | 10/37 | Holliday | 339—89 |
| 2,231,124 | 2/41 | Joseph | 339—89 |
| 2,440,270 | 4/48 | Hecht | 339—275 X |
| 2,465,540 | 3/49 | Korn | 339—275 X |
| 2,695,379 | 11/54 | Myers et al. | |
| 2,864,156 | 12/58 | Cardy. | |
| 2,889,532 | 6/59 | Slack | 339—18 |
| 2,967,979 | 1/61 | Plesser et al. | |
| 3,070,650 | 12/62 | Stearns | 174—68.5 X |
| 3,077,511 | 2/63 | Bohrer et al. | 339—17 X |

JOSEPH D. SEERS, *Primary Examiner.*